US011809982B2

(12) United States Patent
Yasuda et al.

(10) Patent No.: US 11,809,982 B2
(45) Date of Patent: Nov. 7, 2023

(54) PERFORMANCE AND AREA EFFICIENT SYNAPSE MEMORY CELL STRUCTURE

(71) Applicant: INTERNATIONAL BUSINESS MACHINES CORPORATION, Armonk, NY (US)

(72) Inventors: Takeo Yasuda, Nara (JP); Kohji Hosokawa, Shiga-ken (JP); Junka Okazawa, Kyoto (JP); Akiyo Iwashina, Kanagawa-ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 892 days.

(21) Appl. No.: 16/782,758

(22) Filed: Feb. 5, 2020

(65) Prior Publication Data

US 2021/0241086 A1    Aug. 5, 2021

(51) Int. Cl.
*G06N 3/06*       (2006.01)
*G06N 3/065*    (2023.01)

(52) U.S. Cl.
CPC .................................. *G06N 3/065* (2023.01)

(58) Field of Classification Search
CPC ...... G06N 3/065; G11C 7/08; G11C 11/1693; G11C 11/1675; G11C 11/1677; G11C 11/54; G11C 27/005; G11C 7/10
See application file for complete search history.

(56) References Cited

U.S. PATENT DOCUMENTS

| 2018/0130528 A1* | 5/2018 | Hosokawa | G06N 3/063 |
| 2019/0206490 A1 | 7/2019 | Hosokawa et al. | |
| 2019/0228295 A1 | 7/2019 | Yasuda et al. | |

OTHER PUBLICATIONS

International Search Report issued in PCT Application No. PCT/IB2021/050854, dated May 7, 2021, pp. 1-9.
Anonymous, "Method and System for Forming Multiple Resistive Random-Access Memory (ReRAM) Structure in a Single Cell", IP.com Prior Art Database Technical Disclosure. IP.com No. IPCOM000257665D. Feb. 28, 2019. (pp. 1-8.).
Boybat et al., "Neuromorphic computing with multi-memristive synapses", Nature Communications. vol. 9, No. 1. Jun. 28, 2018. (pp. 1-12.).
Kim et al., "Efficient Synapse Memory Structure for Reconfigurable Digital Neuromorphic Hardware", Frontiers in Neuroscience. Nov. 20, 2018. vol. 12, Article 829. (pp. 1-16.).

\* cited by examiner

*Primary Examiner* — Mohammed A Bashar
(74) *Attorney, Agent, or Firm* — Tutunjian & Bitetto, P.C.; Robert Richard Aragona (57) ABSTRACT

A synapse memory system includes a plurality of synapse memory cells, a write portion, and read drivers. Each synapse memory cells is disposed at cross points of axon lines and dendrite lines and includes a plurality of analog memory devices and each synapse memory cell is configured to store a weight value according to an output level of a write signal. The plurality of analog memory devices is combined to constitute each synapse memory cell. The write portion is configured to write the weight value to each synapse memory cell and includes a write driver and an output controller. The write driver is configured to output the write signal to each synapse memory cell and the output controller is configured to control the output level of the write signal of the write driver. The read drivers are configured to read the weight value stored in the synapse memory cells.

16 Claims, 7 Drawing Sheets

PERFORMANCE AND AREA EFFICIENT SYNAPSE MEMORY CELL STRUCTURE

BACKGROUND

Technical Field

The present invention relates generally to memory devices, and more specifically, to a performance and area efficient synapse memory cell structure.

Description of the Related Art

An analog memory, which has characteristics such that its resistance and capacitance that can be controlled continuously, is typically used as a memory device to store a synapse weight value in a neural network system.

SUMMARY

According to an aspect of the present invention, a synapse memory system includes a plurality of synapse memory cells, a write portion, and read drivers. Each synapse memory cells is disposed at cross points of a plurality of axon lines and a plurality of dendrite lines. Each synapse memory cell includes a plurality of analog memory devices. Each synapse memory cell is configured to store a weight value according to an output level of a write signal. The weight value to be stored in each synapse memory cell is one value of at least three different values. The plurality of analog memory devices is combined to constitute each synapse memory cell. The write portion is configured to write the weight value to each synapse memory cell. The write portion includes a write driver and an output controller. The write driver is configured to output the write signal to a subject synapse memory cell. The subject synapse memory cell is one of the synapse memory cells. The subject synapse memory cell is selected to store the weight value. The output controller is configured to control the output level of the write signal of the write driver. The read drivers are configured to read the weight value stored in the synapse memory cells.

According to another aspect of the present invention, there is a device including the aforementioned synapse memory system.

According to yet another aspect of the present invention, an analog memory of the synapse memory system includes a free layer and a plurality of pinning layers. The free layer includes fixed regions disposed at end portions thereof and a data region interposed between the fixed regions. The plurality of pinning layers is disposed on each respective fixed region such that excitation of the fixed regions by the pinning layers induces opposed magnetic fields in each respective fixed region. The opposed magnetic fields define a domain wall at an inflection point of the opposed magnetic fields of the fixed regions.

In an aspect of the present invention, there is a synapse memory system including the analog memory system.

In yet another aspect of the present invention, a synapse memory system includes a synapse memory including a plurality of synapse memory cells disposed at cross points of a plurality of axon lines and a plurality of dendrite lines, wherein a length of the synapse memory along an axon line portion compared to a length of the synapse memory along a dendrite line portion defines an aspect ratio. The synapse memory system also includes a first plurality of peripheral devices operably coupled to the axon line portion of the synapse memory and a second plurality of peripheral devices operably coupled to the dendrite line portion of the synapse memory, wherein the aspect ratio of the synapse memory is almost 1:1.

DETAILED DESCRIPTION

Hereinafter, embodiments of the present invention will be described in detail with reference to the attached drawings. It is to be noted that the present invention is not limited to the embodiments described hereinbelow and may be implemented with various modifications within the scope of the present invention. In addition, the drawings used herein are for purposes of illustration, and do not show actual dimensions.

Figure 1:
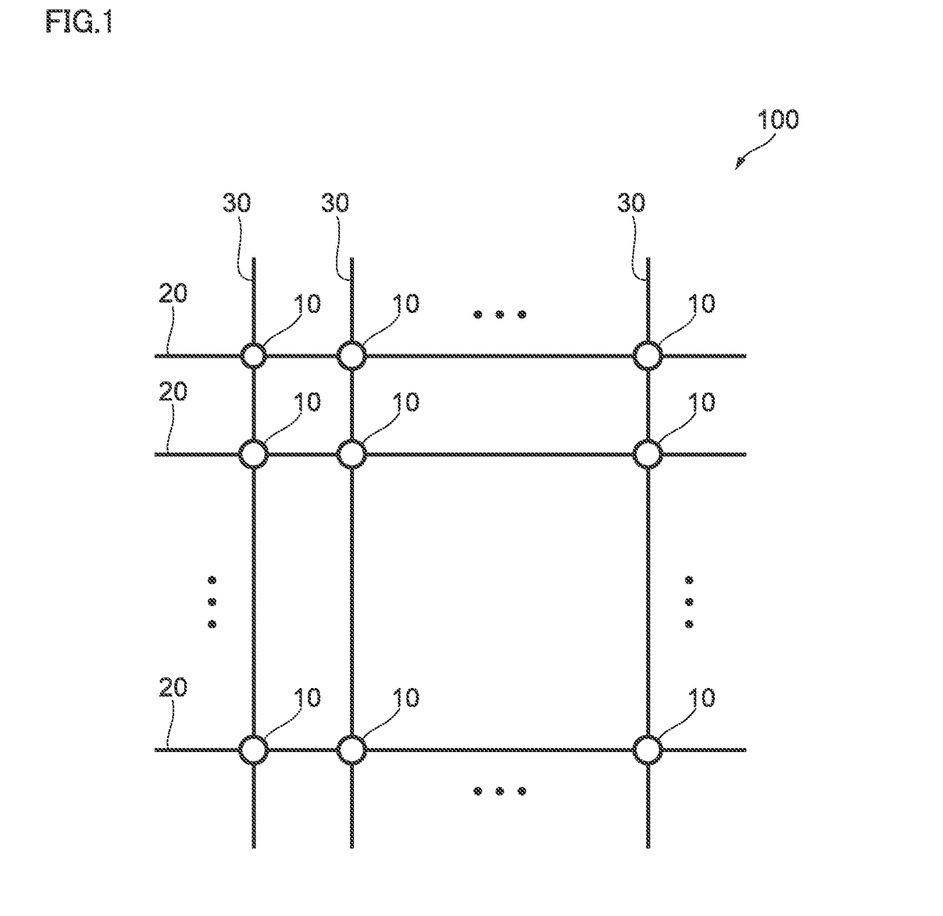
FIG. 1 shows a synapse memory having a cross-bar array according to an embodiment of the present invention.

With reference to FIG. 1, a synapse memory 100 having a cross-bar array is illustrated according to an embodiment of the present invention. In embodiments, hardware implementation of a neuromorphic system may include synapse memories as well as neuron bodies and network connection with axons and dendrites. As shown in FIG. 1, the synapse memory 100 may include synapse memory cells 10 arranged/placed at all cross points of all axons (axon lines) 20 and all dendrites (dendrite lines) 30. Each of the synapse memory cells 10 may be configured to store a synapse weight value, which indicates a weight of synapse connection of the corresponding synapse memory cell 10. As can be appreciated, the axons 20 correspond to respective axons of pre-neurons and the dendrites 30 correspond to respective dendrites of post-neurons. In embodiments, the memory device for the synapse memory cell 10 may be a non-volatile random access memory (NVRAM), which is an analog memory. The synapse memory cell 10 will be described in further detail hereinbelow.

Figure 2:
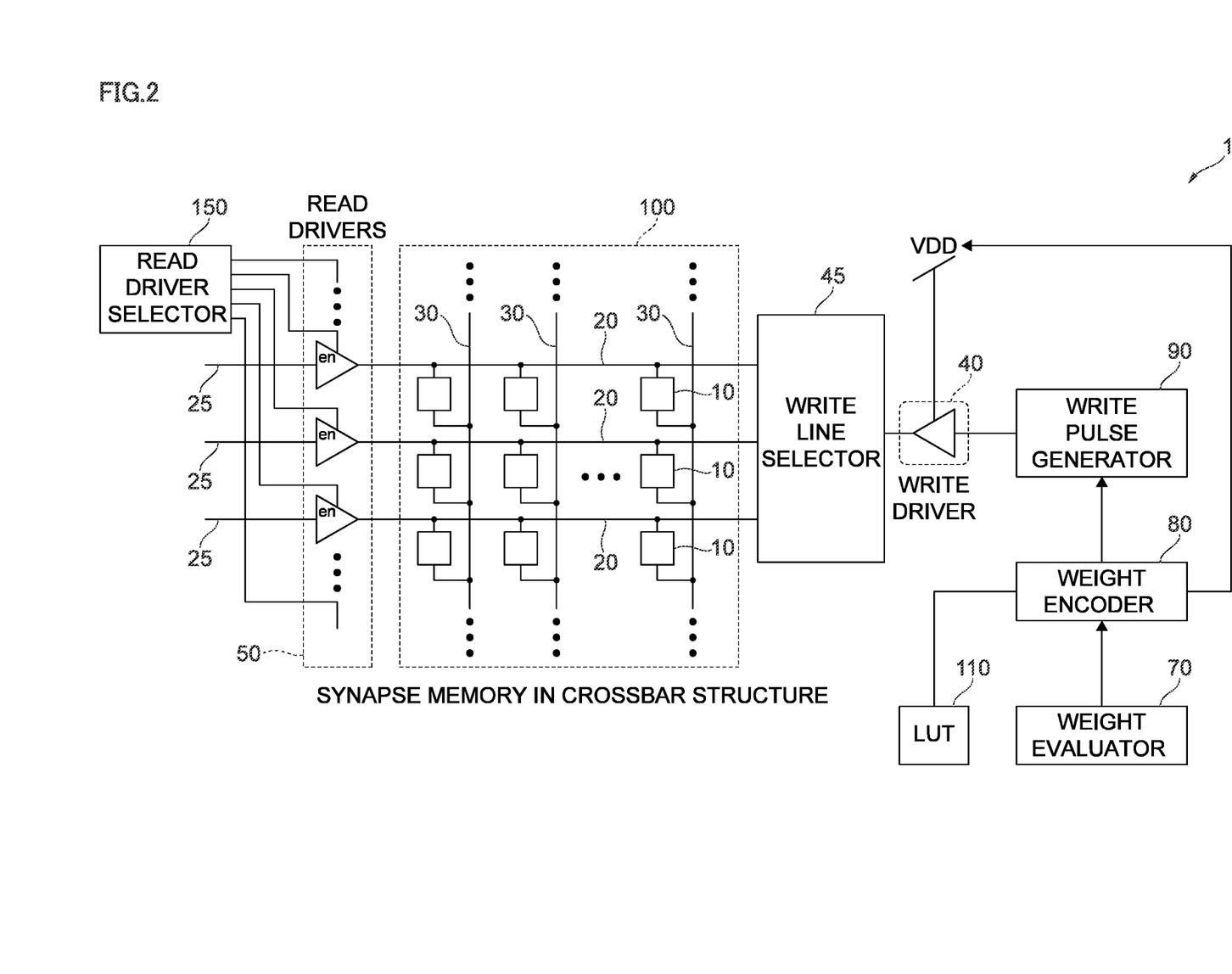
FIG. 2 shows a synapse memory system according to an embodiment of the present invention.

Turning to FIG. 2, a synapse memory system 1 is illustrated and includes the synapse memory 100, a write driver 40, a write line selector 45, read drivers 50, a read driver selector 150, a weight evaluator 70, a weight encoder 80, and a write pulse generator 90. It is contemplated that the synapse memory system 1 can be a neuromorphic system on silicon.

The synapse memory 100 has a cross-bar array of axons 20 and dendrites 30 and includes synapse memory cells 10 arranged at all cross points of the axons 20 and the dendrites 30. In one non-limiting embodiment, the synapse memory 100 as described herein assumes that writing the synapse weight value to the NVRAM is executed by controlling the voltage value.

In embodiments, the write driver (synapse memory cell driver) 40 is connected to the synapse memory 100. The write driver 40 may be configured to write the synapse weight value to the respective synapse memory cells 10 in response to a learning operation input or a recognition operation input. In this manner, the write driver 40 may apply a voltage to the respective axons 20 selected by the write line selector 45. The write line selector 45 selects the axons 20 to which the write driver 40 applies the voltage. In embodiments, the write line selector 45 switches the selected axons 20 in a predetermined order at a certain timing. In one non-limiting embodiment, the weight encoder 80 controls the write driver 40 and the write line selector 45 to apply the voltage to the synapse memory cell(s) 10 provided on the axon(s) 20 selected by the write line selector 45 according to the switching timing of the write line selector 45. This enables the single pair of the write driver 40 and the write line selector 45 to write the synapse weight value to all of the synapse memory cells 10 provided on the respective axons 20.

In embodiments, the dendrites 30 are connected to a dendrite driver (not shown) that selects, from the dendrites 30, a subject dendrite(s) with which the synapse weight value is written in write operation or read in read operation of the synapse weight value. In this manner, the dendrite driver may selectively apply the voltage to the dendrites 30. This enables the dendrite driver to determine the subject dendrite(s). In embodiments, in the write operation of the synapse weight value, the dendrite driver sets one of the dendrites 30 to a ground (GND) state and sets the others of the dendrites 30 to a high impedance (Hi-Z) state. The write line selector 45 selects one of the axons 20 which is connected to the write driver 40 to apply the voltage thereto. This results in the synapse weight value being written in the synapse memory cell 10 on the cross point of the dendrite 30 set to the GND state and the axon 20 applied with the voltage by the write driver 40. The write driver 40 receives a pulse signal for controlling an output timing. The write driver 40 is applied with a driving voltage (VDD). In one non-limiting embodiment, the write driver 40 is configured to control the voltage applied to the synapse memory cells 10.

In aspects of the present invention, the read drivers 50 are connected to the synapse memory 100. The read drivers 50 may be configured to read the synapse weight value from the synapse memory cells 10 in response to a recognition operation input. In this manner, the dendrite driver (not shown) sets a dendrite(s) 30 with which the synapse weight value is read to the GND state and sets the others of the dendrites 30 to the Hi-Z state. The read driver selector 150 selects or enables the read drivers 50 which correspond to the axon(s) 20 to apply the voltage thereto. This results in the synapse weight value being read from the synapse memory cell 10 on the cross point of the dendrite 30 set to the GND state and the axon 20 applied with the voltage by the read drivers 50. In the read operation of the synapse weight value, a total synapse weight value is read for each dendrite 30 set to the GND state. The total synapse weight value is a sum of the synapse weight values of the respective synapse memory cells 10 which are on the axon 20 being applied with the voltage.

In embodiments, the weight evaluator 70 may evaluate the current synapse weight value with a neuron output signal from the dendrites 30 and determine the next synapse weight value. In this manner, the weight evaluator 70 compares the neuron output signal obtained from the dendrites 30 with a desired output signal given as a learning operation input and calculates the next synapse weight value with which the current synapse weight value stored in the synapse memory cell 10 is to be updated.

In embodiments, the weight encoder 80 may encode the next synapse weight value calculated by the weight evaluator 70. The weight encoder 80 controls the driving voltage of the write driver 40 based on the next synapse weight value calculated by the weight evaluator 70. As can be appreciated, this enables the write driver 40 to control the voltage applied to the synapse memory cells 10.

In one non-limiting embodiment, the write pulse generator 90 may conduct a modulation process, such as pulse width modulation and pulse number (or frequency) modulation. In other words, the write pulse generator 90 may generate and output a pulse signal based on the encoded value generated by the weight encoder 80. This pulse signal and the driving voltage controlled by the weight encoder 80 lead the write driver 40 to update the current synapse weight value stored in the synapse memory cell 10.

To update the current synapse weight value, several methods can be applicable such as (i) a method adding a gap between the current synapse weight value and the next synapse weight value to the current synapse weight value, and (ii) a method resetting the current synapse weight to the minimum value, thus writing the next synapse weight value.

For example, the method (i) can be applicable to update the synapse weight value by decreasing it in the following cases. That is to say, the NVRAM used as the synapse memory cell 10 can reduce a stored value by applying a voltage having opposite polarity to a voltage applied for increasing the stored value, and a decreasing amount of the stored synapse weight value can be controlled by a value of the supply voltage.

In the method (i), several levels as to the output value of the write driver 40 can be set for controlling the synapse weight value. In one non-limiting embodiment, the levels are "driver common level," "set threshold level," and "reset threshold level." The driver common level is a voltage level when the write driver 40 is in an off state (inactive). The synapse memory cell 10 is configured to keep the current weight value if the output of the write driver 40 is between the set threshold level and the reset threshold level or in high impedance (Hi-Z) state and the voltage value applied to the dendrites 30 is at the driver common level. The set threshold level, e.g., a positive threshold level, is a voltage level at or over which the write operation to increase the synapse weight value is executable. The reset threshold level, e.g., a negative threshold level, is a voltage level at or under which the write operation to decrease the synapse weight value is executable. As can be appreciated, the output value of the write driver 40 is an example of the claimed output level.

Figure 3:
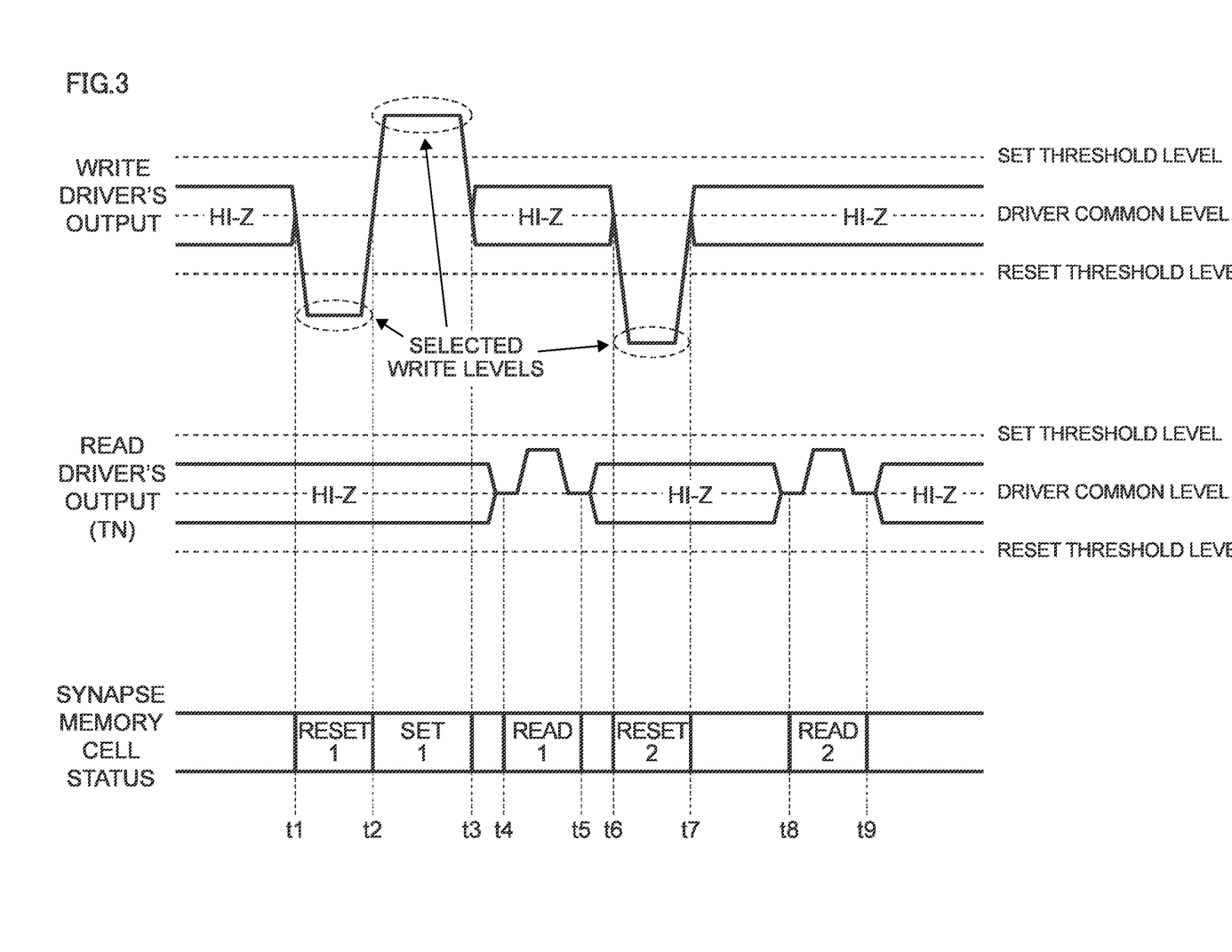
FIG. 3 shows a timing chart depicting timings of signal outputs according to an embodiment of the present disclosure.

FIG. 3 illustrates a time chart showing timings of signal outputs from the write driver 40, timings of signal outputs from the read drivers 50, and timings of state transitions of the synapse memory cell 10.

(1) As illustrated in the time chart of FIG. 3, initially, from time t1 to time t2 (period t1-t2), the write driver 40 applies the voltage lower than the reset threshold level to the one of the synapse memory cells 10 (target cell) so that the write driver 40 sets the target cell to a reset state (a certain decremented value). In this manner, the write operation to decrease the synapse weight value is performed. The value to be decremented in the target cell depends on an amount by which the voltage applied by the write driver 40 falls below the reset threshold level. In the time chart, this operation is performed at a state "Reset1."

(2) Next, from time t2 to time t3 (period t2-t3), the write driver 40 applies the voltage higher than the set threshold level to the target cell so that the write driver 40 sets the target cell to a set state (a certain incremented value). In this manner, the write operation to increase the synapse weight value is performed. The value to be incremented in target cell depends on an amount by which the voltage applied by the write driver 40 exceeds the set threshold level. In the time chart, this operation is performed at a state "Set1."

(3) Next, from time t4 to time t5 (period t4-t5), the read drivers 50 apply the voltage between the driver common level and the set threshold level to the target cell so that the read drivers 50 set the target cell to a read state. In this manner, the read operation of the synapse weight value is performed. If the target cell read in this state is the same one that was written in the "Set1" state, the value to be read at this point corresponds to the synapse weight value updated at the above step (2). In the time chart, this operation is performed at a state "Read1."

(4) Next, from time t6 to time t7 (period t6-t7), the write driver 40 applies the voltage lower than the reset threshold level to the target cell so that the write driver 40 sets the target cell to another reset state to another decremented value. That is to say, the write operation to decrease the synapse weight value is performed. In the time chart, this operation is performed at a state "Reset2."

(5) Thereafter, from time t8 to time t9 (period t8-t9), the read drivers 50 apply the voltage between the driver common level and the set threshold level to the target cell so that the read drivers 50 set the target cell to another read state. In this manner, the read operation of the synapse weight value is performed. If the target cell read in this state is the same one that was written in the "Reset2" state, the value to be read at this point corresponds to the synapse weight value updated at the above step (4). In the time chart, this operation is performed at a state "Read2."

(6) In a period other than the periods t1-t2, t2-t3, and t6-t7, the target cell is set to the high impedance (Hi-Z) state against the write driver 40. In this manner, the write operation is not performed in the period. Further, in a period other than the periods t4-t5 and t8-t9, the target cell is set to the high impedance state against the read drivers 50. As such, the read operation is not performed in the period.

It is contemplated that when the write driver 40 is in the off state, the applied voltage to the synapse memory cell 10 is between the set threshold level and the reset threshold level or high impedance state and the synapse memory cell 10 keeps the current weight value. This prevents the write operation of the synapse weight value. In response to an output signal from the write driver 40, the applied voltage shifts from the driver common level to or above the set threshold level or to or below the reset threshold level.

In embodiments, when the voltage applied by the write driver 40 exceeds the set threshold level, the synapse weight value is updated to be increased. An amount of the increment depends on an amount by which the voltage applied by the write driver 40 exceeds the set threshold level. In this manner, controlling the exceeding amount by adjusting the voltage applied by the write driver 40, namely by selecting a write level, enables to control the increment amount of the synapse weight value.

It is envisioned that when the voltage applied by the write driver 40 falls below the reset threshold level, the synapse weight value is updated to be decreased. An amount of the decrement depends on an amount by which the voltage applied by the write driver 40 falls below the reset threshold level. In this manner, controlling the falling amount by adjusting the voltage applied by the write driver 40, namely by selecting a write level, enables to control the decrement amount of the synapse weight value.

As can be appreciated, if the applied voltage is in a range between the set threshold level and the reset threshold level, the synapse weight value is maintained. In other words, the write operation on the synapse memory cell 10 is not conducted. The read drivers 50 read the synapse weight value from the synapse memory cells 10 by applying the voltage in this range to the synapse memory cells 10.

It is contemplated that a non-volatile random access memory (NVRAM), which is an analog memory, may be used as the synapse memory cell 10. The analog memory has characteristics such that its resistance and capacitance can by controlled continuously. Examples of the NVRAM include a flash memory, a ferroelectric random access memory (FeRAM), a magnetoresistive random access memory (MRAM), a phase change random access memory (PRAM) and a resistive random access memory (ReRAM), etc.

In embodiments, writing data to the NVRAM is executed by applying a voltage or a current to the NVRAM. The NVRAM can store the data using a state change of a corresponding synapse memory cell 10, in response to the applied voltage or current. As can be appreciated, the state change used for recording data depends on structure of the NVRAM. For example, the state change may include a change in an electrical state, a change in a magnetic state, and a change in phases.

The extent of the state change may vary depending on magnitude of the applied voltage or current, i.e. a voltage value or a current value. This enables the NVRAM to store a continuous value (analog value) or a multi-value (discrete value). It is contemplated that the NVRAM can store and hold a value being one of at least three different (not digital) values. In other words, the NVRAM can be used as an analog memory. In one non-limiting embodiment, the synapse memory cell 10 is constituted by the NVRAM, so that controlling the voltage value or the current value to be applied to the NVRAM enables to control the synapse weight value stored in the synapse memory cell 10. In this manner, if the voltage value is used to control write operation, a larger voltage value allows the NVRAM to store a larger synapse weight value. This tuning of the voltage (current) can be done after manufacturing of a synapse memory system 1 (as will be described in further detail hereinbelow). As can be appreciated, whether to use the voltage value or the current value to control the write operation on the NVRAM can be determined based on a characteristic of the NVRAM, such as a type of change in the state used for data recording, and variation width, speed, or precision of the state change that varies depending on the voltage value or the current value.

In embodiments, in order to achieve good performance as a neural network system, the synapse memory cell 100 is desired to have more than enough resolution steps. However, lots of memory devices have considerably low resolution or small dynamic range and it is difficult to improve them because of device characteristic and noise margin.

In view of this, the present embodiment combines multiple memory devices with low resolution or small dynamic range (or both) as a single synapse memory (synapse memory cell 10). In one non-limiting embodiment, a different magnitude may be assigned for each device so that total dynamic range can be increased.

Figure 4:
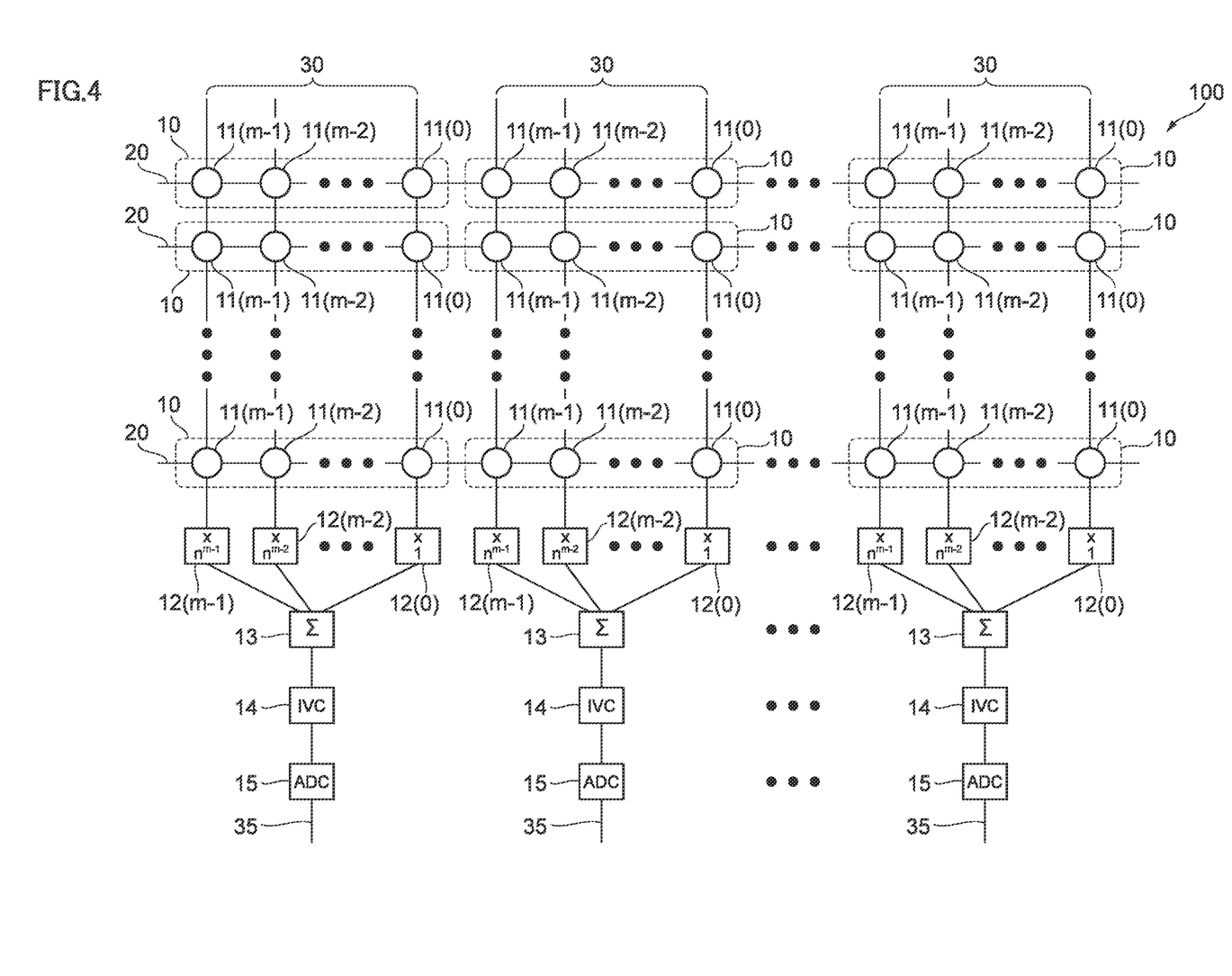
FIG. 4 shows the synapse memory and synapse memory cells of FIG. 1, each composed of multiple memory devices.

FIG. 4 depicts the synapse memory 100 and the synapse memory cells 10 each composed of multiple memory devices. As illustrated in FIG. 4, m memory devices 11 are combined to constitute one synapse memory cell 10. In embodiments, the memory devices 11 included in one synapse memory cell 10 are assumed to have the same device characteristic. In one non-limiting embodiment, each memory device 11 includes n resolution steps.

As can be appreciated, since one synapse memory cell 10 is composed of m memory devices 11, m lines of dendrites corresponding to the respective memory devices 11 are connected in one synapse memory cell 10. These m lines constitute one set of dendrites 30. Each of the m lines constituting one set of dendrites 30 is assigned with a number in the range of 0 to (m−1). When the memory devices 11 constituting the synapse memory cell 10 are to be distinguished from each other, each of the memory devices 11 is hereinafter noted with the number of the line connected to that memory device 11, e.g., the memory device 11(0), the memory device 11(1) ... the memory device 11(m−2), and the memory device 11(m−1).

In embodiments, the resolution of the synapse memory cell 10 as a whole shown in FIG. 4 is determined by a combination of dynamic ranges of the multiple memory devices 11. In one non-limiting embodiment, the resolution of the synapse memory cell 10 as a whole is expressed by an exponential scale using resolution (n) of the memory devices 11 with n as the base. Accordingly, each memory device 11 is assigned with a different magnitude. In this manner, assuming that the resolution of the synapse memory cell 10 is a value of m digits, the memory device 11(0) represents the first digit, the memory device 11(1) represents the second digit ... the memory device 11(m−2) represents the (m−1)-th digit, and the memory device 11(m−1) represents the m-th digit.

In embodiments, to obtain the resolution of the synapse memory cell 10 as a whole, a current from each of the lines constituting one set of dendrites 30 is converted by converters 12(k−1) (k=1, 2, ..., m) according to the digit expressed by the corresponding memory device 11. In this manner, a current from the line connected to the memory device 11(0) is multiplied by one (or $n^0$), a current from the line connected to the memory device 11(1) is multiplied by n (or $n^1$), ... a current from the line connected to the memory device 11(m−2) is multiplied by $n^{m-2}$, and a current from the line connected to the memory device 11(m−1) is multiplied by $n^{m-1}$. Thus, the output from each line can represent the digit of the corresponding memory device 11(k−1) (k=1, 2, ..., m) that forms part of the value of the resolution of the synapse memory cell 10 as a whole.

In one non-limiting embodiment, an adder 13 adds up the currents from the lines. As described hereinabove, the output current from each of the lines has been converted according to the digits of the resolution of the synapse memory cell 10, and thus adding up these currents allows to obtain a current corresponding to the resolution of the synapse memory cell 10 as a whole. Then, a current-to-voltage converter (IVC) 14 converts the output value into a voltage, which is then undergoes analog-to-digital conversion by an analog-to-digital converter (ADC) 15. The thus-obtained digital value is outputted as an output signal from the merged dendrites 35.

Figure 7:
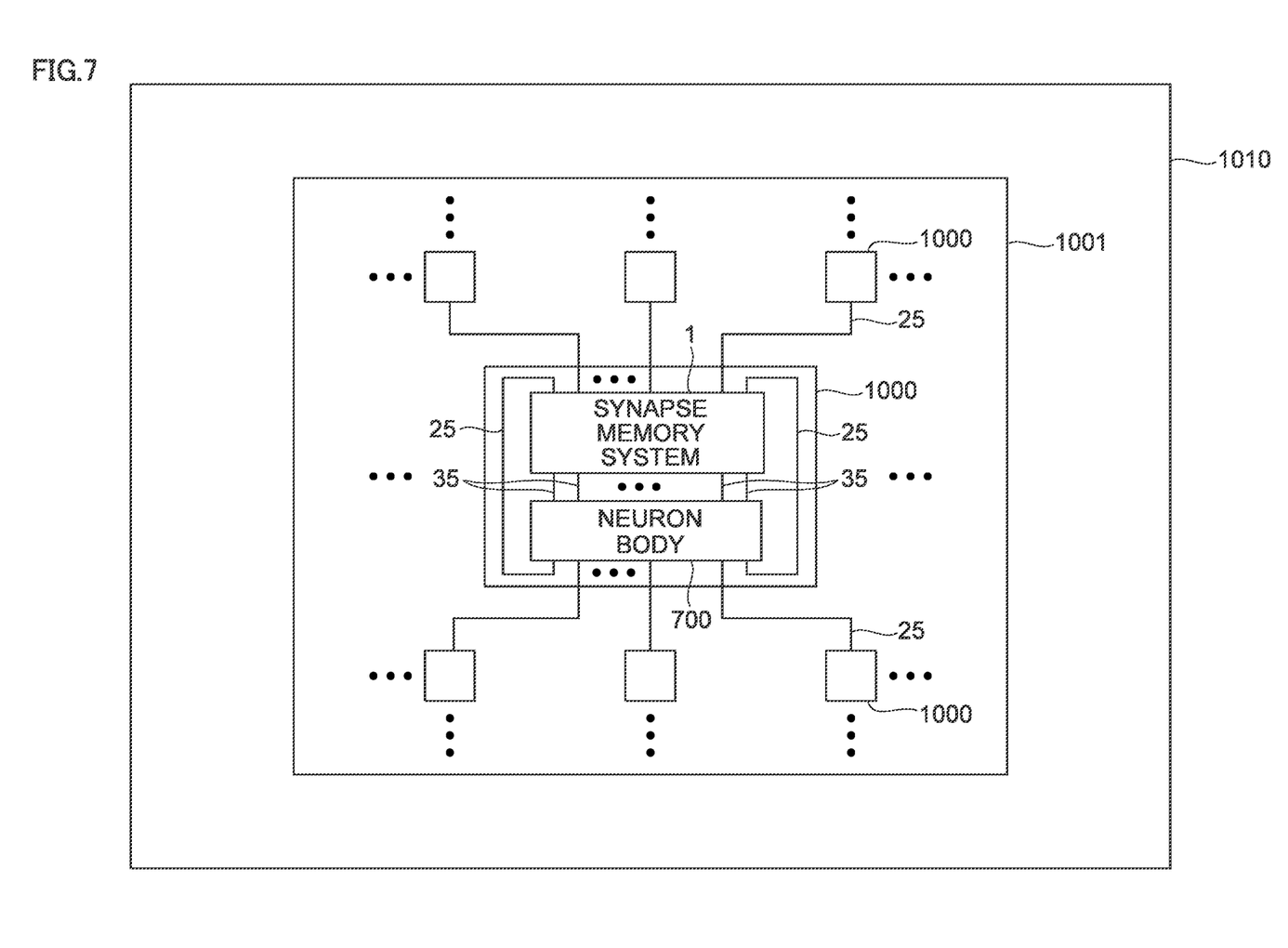
FIG. 7 shows a device which includes a neuro-synaptic core system.

FIG. 7 depicts an embodiment of a device 1010 which includes a neuro-synaptic core system 1000. It is contemplated that the synapse memory system 1 may be provided on the device 1010, such as a computer. In one non-limiting embodiment, multiple neuro-synaptic core systems 1000 are provided on a chip 1001, such as a semiconductor chip. The chip 1001 is then mounted on the device 1010.

In embodiments, each of the neuro-synaptic core systems 1000 includes the synapse memory system 1 and a neuron body 700. The neuron body 700 performs neuron operations. In this manner, the neuron body 700 obtains the product-sum value of the synapse weight value and input value based on the total current sensed by the current sensor. The total current sensed by the current sensor may represent the product-sum value of the synapse weight values stored in the synapse memory cells 10 on the cross points of the selected axon(s) 20 and one set of dendrites 30 and the input values. Then, the neuron body 700 outputs neuron output corresponding to the total current value.

The neuro-synaptic core systems 1000 are connected to each other via the pre-driven axons 25. The synapse memory system 1 is connected to a pre-neuron via the pre-driven axon 25. The neuron body 700 is a part of the post-neuron and its output is pre-driven axon 25 which is connected to synapse memory systems 1 in the same or other neuro-synaptic core systems 1000. The synapse memory system 1 receives an output signal from the pre-neuron to accumulate the weight values of the synapses whose inputs are activated via their axons 20. If the accumulated value of the multiplied value of synapse weight value and input value from the axon 20 (or pre-driven axon 25) reaches a predetermined threshold, the neuron body 700 outputs the output signal as the neuron output of the post-neuron at the pre-driven axon 25.

Figure 5A:
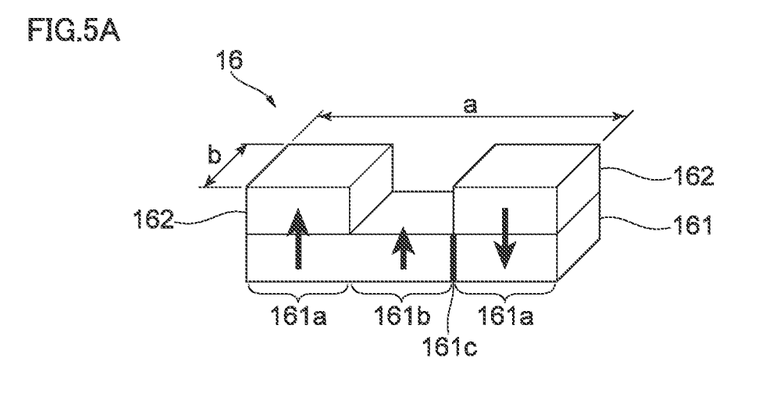
FIG. 5A shows a structure of an analog memory composed of an MRAM.
Figure 5B:
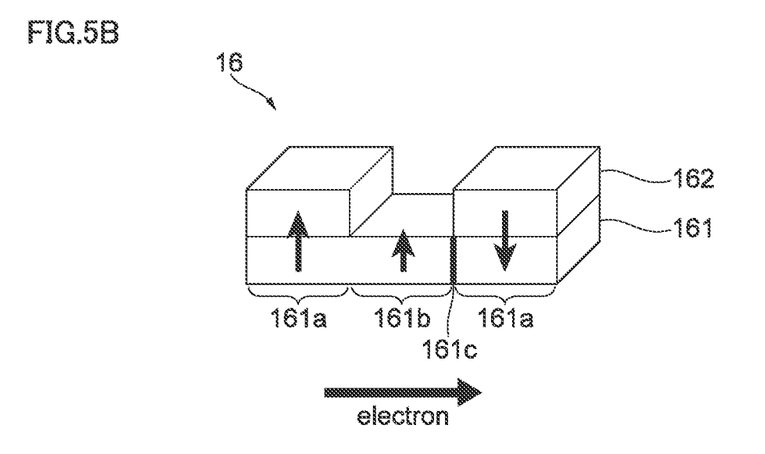
FIG. 5B shows a state where the analog memory of FIG. 5A stores the largest (or the smallest) value.
Figure 5C:
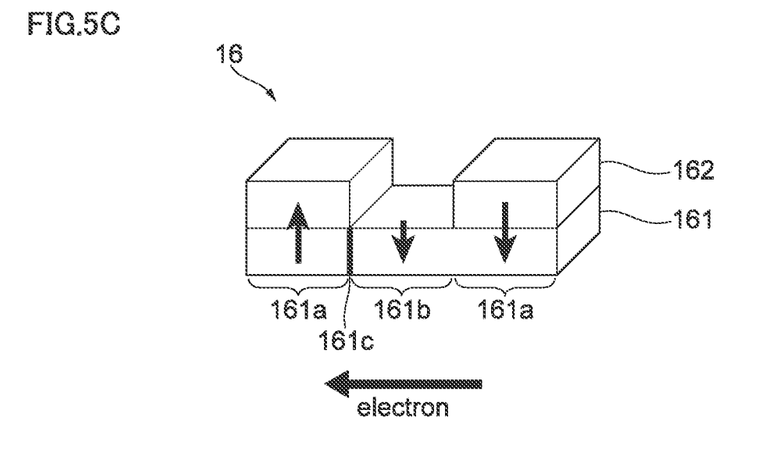
FIG. 5C shows a state where the analog memory of FIG. 5A stores the smallest (or the largest) value.

Turning to FIGS. 5A-5C, FIG. 5A shows an exemplary structure of an analog memory composed of the MRAM, FIG. 5B shows the state where the analog memory of FIG. 5A stores a value "0," and FIG. 5C shows the state where the analog memory of FIG. 5A stores a value "1".

The analog memory 16 includes a free layer 161 and pinning layers 162. The free layer 161 is planar and includes fixed regions 161a at ends thereof and a data region 161b between the fixed regions 161a. The pinning layers 162 are deposited on the respective fixed regions 161a at the ends of the free layer 161.

As the two fixed regions 161a are excited by the pinning layers 162, the two fixed regions 161a have magnetic fields in opposite directions. Due to influence of the fixed regions 161a, the magnet field of the data region 161b may be identical to the magnetic field of either fixed region 161a or may partially include the magnetic fields of both fixed regions 161a. The boundary at which the magnetic field of the data region 161b changes is referred to as a domain wall 161c. As the fixed regions 161a are excited by the pinning layers 162, the position of the domain wall 161c moves in the data region 161b between the fixed regions 161a. An analog value is stored according to the position of the domain wall 161c.

As can be appreciated, to increase the dynamic range of the analog memory 16 configured as above, it is required to increase, as much as possible, the length on which the domain wall 161c can move. In other words, the length of the data region 161b (the length a in FIG. 5A) needs to be as long as possible, and a distance between the two fixed regions 161a needs to be as long as possible.

Meanwhile, when the domain wall 161c moves between the two fixed regions 161a (FIGS. 5B and 5C) in writing a memory, current (or electron movement per unit time) more than a certain threshold amount is brought by the voltage of more than the set threshold level or reset threshold level in FIG. 3. The direction of this electron movement (opposite of the current direction) is shown in FIGS. 5B and 5C. The amount of domain wall 161c movement depends on the current (the amount of electrons moved in a unit time). As can be appreciated, the number of recording value steps of the memory within its full range is proportional to the length of the data region 161b where the domain wall 161c can move from that of in FIG. 5B to that of in FIG. 5C. It is envisioned that the length of a of the device 16 illustrated FIG. 5A should be maximized. On the other hand, recording current is proportional to the cross-section area of the memory device which is vertical to the flowing current. It is contemplated that the width b of the device 16 illustrated in FIG. 5A should be minimized to reduce the recording current to reduce the power consumption. For these reasons, the shape of the analog memory 16 with a large dynamic range and enough resolution of stored value in low power consumption will exhibit large aspect ratio (e.g., the ratio of a:b illustrated in FIG. 5A).

As can be appreciated, the structure of the analog memory 16 explained with reference to FIGS. 5A to 5C is by way of example only. However, many analog memories exhibit large aspect ratio so that they can have a large dynamic range with a lot of small amount of steps. In embodiments, each of the memory devices 11 of the synapse memory cell 10 explained with reference to FIG. 4 is composed of the analog memory 16 explained with reference to FIGS. 5A to 5C.

Figure 6:
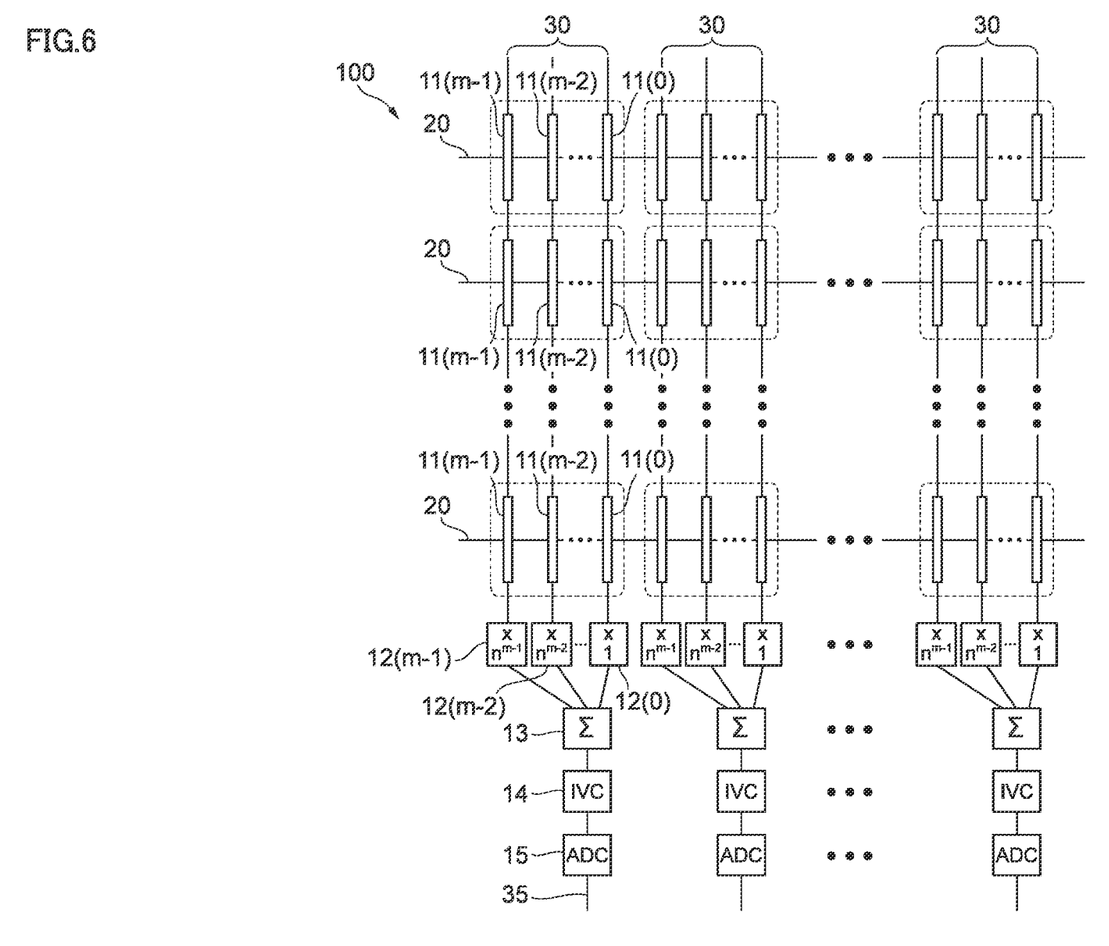
FIG. 6 shows a configuration where the analog memory shown in FIGS. 5A to 5C is used for each memory device in the synapse memory cell.

FIG. 6 shows an embodiment in which the analog memory 16 shown in FIGS. 5A to 5C is used for each memory device 11 in the synapse memory cell 10. As illustrated in FIG. 6, multiple memory devices 11 (analog memories 16) in each synapse memory cell 10 are arranged such that their long sides (the sides along the direction of the length a in FIG. 5A) are parallel to each other. As can be appreciated, this can reduce the aspect ratio of the synapse memory cell 10 as a whole (e.g., the ratio of the longitudinal direction of the memory devices 11 to the direction in which the memory devices 11 are arranged) relative to the aspect ratio of individual memory devices 11. As can be appreciated, this increases flexibility in the shape of the synapse memory cell 10 and the synapse memory 100 in the configuration where multiple memory devices 11 are combined as one synapse memory cell 10.

Referring back to FIG. 2, it is contemplated that the synapse memory system 1 may include external blocks or may include peripheral devices connected to the synapse memory 100. These peripheral devices include those provided on the axons 20 side of the synapse memory 100 and those provided on the merged dendrites 35 side of the synapse memory 100. Under normal operations of the synapse memory system 1 involving inference (or recognition) and training, a signal output from an anterior neuron body 700 is input via the pre-driven axons 25 to the synapse memory 100, which in turn outputs the signal via the merged dendrites 35 to a posterior neuron body 700. On the other hand, under operation of the synapse memory system 1 involving back propagation, a signal output from the posterior neuron body 700 is input via the merged dendrites 35 to the synapse memory 100, which in turn outputs the signal via the pre-driven axons 25 to the anterior neuron body 700.

As can be appreciated, a group of peripheral devices of almost same size is provided on both of the axons 20 (or pre-driven axons 25) side and the dendrites 30 (or the merged dendrites 35) side of the synapse memory 100. Thus, as the aspect ratio of the synapse memory 100 (namely the ratio of length along its axons 20 to length along its dendrites 30) gets closer to 1:1, it becomes easier to place the peripheral devices relative to the synapse memory 100 and thus becomes easier to design the synapse memory system 1.

Referring again to FIG. 4, when the synapse memory cell 10 is composed of multiple memory devices 11, the synapse memory cell 10 may have large aspect ratio depending on the number of memory devices 11 included in the synapse memory cell 10. In this manner, in order to reduce aspect ratio of the synapse memory 100 as a whole, the synapse memory cells 10 need to be spaced with blank gap of a certain distance from each other in vertical direction according to the aspect ratio of each synapse memory cell 10, which results in useless space being created. On the other hand, arranging the analog memories 16 as the memory devices 11 in each synapse memory cell 10 as shown in FIG. 6 can reduce the aspect ratio of the synapse memory 100 as a whole while eliminating useless space.

It is envisioned that multiple memory devices 11 (analog memories 16) in each synapse memory cell 10 are arranged such that their long sides are parallel to each other. This can make the aspect ratio of the synapse memory cell 10 close to 1:1. Thus, the synapse memory 100 composed of such synapse memory cells 10 can have aspect ratio close to 1:1 with no useless space between the synapse memory cells 10.

The descriptions of the various embodiments of the present invention have been presented for purposes of illustration, but are not intended to be exhaustive or limited to the embodiments disclosed. Many modifications and variations will be apparent to those or ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A synapse memory system comprising:
   a plurality of synapse memory cells disposed at cross points of a plurality of axon lines and a plurality of dendrite lines, each synapse memory cell including a plurality of analog memory devices each including a plurality of resolution steps, each synapse memory cell being configured to store a weight value according to an output level of a write signal, the weight value to be stored in each synapse memory cell being one value of at least three different values, the plurality of analog memory devices each including the plurality of resolution steps being combined to constitute each synapse memory cell expressed by an exponential scale using the plurality of resolution steps of all of the synapse memory cells;
   a write portion configured to write the weight value to each synapse memory cell, the write portion comprising a write driver and an output controller, the write driver being configured to output the write signal to a subject synapse memory cell, the subject synapse memory cell being one of the plurality of synapse memory cells, the subject synapse memory cell being selected to store the weight value, the output controller being configured to control the output level of the write signal of the write driver; and read drivers configured to read the weight value stored in the synapse memory cells.

2. The synapse memory system according to claim 1, wherein dynamic ranges of the plurality of analog memory devices are combined to obtain a dynamic range of each synapse memory cell as a whole.

3. The synapse memory system according to claim 2, wherein each of the plurality of analog memory devices is assigned with a different magnitude.

4. The synapse memory system according to claim 1, wherein each of the plurality of synapse memory cells is arranged such that long sides of the plurality of analog memory devices included in each synapse memory cell are parallel to each other.

5. The synapse memory system according to claim 4, wherein an aspect ratio of each synapse memory cell is smaller than an aspect ratio of each analog memory device.

6. The synapse memory system according to claim 4, wherein an aspect ratio of each synapse memory cell is almost 1:1.

7. The synapse memory system according to claim 1, wherein each analog memory device is a non-volatile random access memory (NVRAM).

8. The synapse memory system according to claim 1, wherein each analog memory device is a magnetoresistive random access memory (MRAM).

9. A device comprising:
a synapse memory system, comprising:
a plurality of synapse memory cells disposed at cross points of a plurality of axon lines and a plurality of dendrite lines, each synapse memory cell including a plurality of analog memory devices each including a plurality of resolution steps, each synapse memory cell being configured to store a weight value according to an output level of a write signal, the weight value to be stored in each synapse memory cell being one value of at least three different values, the plurality of analog memory devices each including the plurality of resolution steps being combined to constitute each synapse memory cell expressed by an exponential scale using the plurality of resolution steps of all of the synapse memory cells;
a write portion configured to write the weight value to each synapse memory cell, the write portion comprising a write driver and an output controller, the write driver being configured to output the write signal to a subject synapse memory cell, the subject synapse memory cell being one of the plurality of synapse memory cells, the subject synapse memory cell being selected to store the weight value, the output controller being configured to control the output level of the write signal of the write driver; and
read drivers configured to read the weight value stored in the synapse memory cells.

10. The device according to claim 9, wherein dynamic ranges of the plurality of analog memory devices are combined to obtain a dynamic range of each synapse memory cell as a whole.

11. The device according to claim 10, wherein each of the plurality of analog memory devices is assigned with a different magnitude.

12. The device according to claim 9, wherein the plurality of synapse memory cells is arranged such that long sides of the plurality of analog memory devices included in each synapse memory cell are parallel to each other.

13. The device according to claim 12, wherein an aspect ratio of each synapse memory cell is smaller than an aspect ratio of each analog memory device.

14. The device according to claim 12, wherein an aspect ratio of each synapse memory cell is almost 1:1.

15. The device according to claim 9, wherein each analog memory device is a non-volatile random access memory (NVRAM).

16. The device according to claim 9, wherein each analog memory device is a magnetoresistive random access memory (MRAM).

* * * * *